United States Patent
Schemmel et al.

(10) Patent No.: US 6,175,646 B1
(45) Date of Patent: *Jan. 16, 2001

(54) APPARATUS FOR DETECTING DEFECTIVE INTEGRATED CIRCUIT DIES IN WAFER FORM

(75) Inventors: Floyd Schemmel; Richard Thorne, both of Sherman, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/064,267

(22) Filed: Apr. 22, 1998

Related U.S. Application Data

(62) Division of application No. 08/923,578, filed on Sep. 4, 1997, now Pat. No. 5,943,551.

(51) Int. Cl.[7] ................................................ G06K 9/00
(52) U.S. Cl. ...................... 382/149; 348/125; 356/237.1
(58) Field of Search .................................... 382/149, 151, 382/148, 145; 356/398, 431, 211, 237.1; 348/125, 126, 129, 130; 438/14, 16, 460

(56) References Cited

U.S. PATENT DOCUMENTS

| Re. 33,956 | 6/1992 | Lin et al. ............................ 250/550 |
| 5,428,442 | 6/1995 | Lin et al. ............................ 356/237 |
| 5,537,325 * | 7/1996 | Iwakiri et al. ................. 364/468.28 |
| 5,621,813 * | 4/1997 | Brown et al. ....................... 382/149 |
| 5,854,674 * | 5/1997 | Lin ..................................... 356/237 |
| 5,943,551 | 8/1999 | Schemmel et al. ................... 438/14 |

* cited by examiner

Primary Examiner—Bhavesh Mehta
(74) Attorney, Agent, or Firm—Mark E. Courtney; W. James Brady; Frederick J. Telecky, Jr.

(57) ABSTRACT

An apparatus and method for detecting defects on silicon dies on a silicon wafer (16) comprising an image acquisition system (10) and a computer (32) that determines a statistical die model by analyzing a random selection of dies (42) within a die matrix (37) and compares the statistical die model to matrices of silicon dies (38) to determine which silicon dies (38) have surface defects, is disclosed.

31 Claims, 4 Drawing Sheets

APPARATUS FOR DETECTING DEFECTIVE INTEGRATED CIRCUIT DIES IN WAFER FORM

This is a divisional application of Ser. No. 08/923,578 filed Sep. 04, 1997, now U.S. Pat. No. 5,943,551.

TECHNICAL FIELD OF THE INVENTION

The present invention relates in general to the field of silicon wafer processing, and more particularly, to an apparatus and method for automating the detection of defects in individual silicon chips.

BACKGROUND OF THE INVENTION

Without limiting the scope of the invention, its background is described in connection with the processing of silicon chips on silicon wafers, such as dynamic random access memory (DRAM), as an example.

Heretofore, in this field, the detection of defects on silicon wafers within individual silicon chips has been performed either manually, or using automated visual systems having a defect detection resolution of 2–4 microns. Unfortunately, the accuracy of detection in many cases was limited by the operator's ability to view a random sample of conventional silicon dies within a specified period of time.

Conventional automated systems have achieved up to a 90% success rate in detecting silicon wafers surface anomalies. These success rates, however, were achieved only under the best conditions of light and contrast. Importantly, reliability of conventional automated systems has been found to degrade rapidly if conditions of lighting and contrast are not ideal.

Furthermore, the limitations of current methods for automatically inspecting silicon dies for defects require substantial visual inspection by an operator. For example, the field of view of present systems is limited to one die, thereby excluding from analysis up to 60% of the available 256 kilobytes of data obtained from a field of view of 125×150 mils. This field of view limits spacial accuracy to about 1:16, with a sub-pixel alignment of 0.25. The problem of the limited field of view of present systems is exacerbated by the inherent difference in the lighting and contrast of the underlying silicon wafer background. The inability of present systems to cope with differences in lighting and contrast is a major stumbling block to further automation of silicon die analysis because differences in wafer background are found to occur even between different silicon wafer lots for the same type of silicon chip.

What is needed is an automated imaging system that is customizable for each silicon wafer that is processed. Also, a need has arisen for an automatic inspection system that is able to adapt to different silicon chip patterns, and that accurately detects surface defects on silicon dies on a silicon wafer. A need has further arisen for a system that is able to meet the needs of high throughput without a loss of accuracy. Finally, a need has arisen for an automated system that is able to adapt to the high precision needs of future silicon chip designs.

SUMMARY OF THE INVENTION

The present invention disclosed herein is an apparatus and method for detecting defects on silicon dies that comprises an image acquisition system and a computer connected to the image acquisition system. The image acquisition system of the present invention captures one or more die images simultaneously. The computer analyzes a random sample of die images to create a statistical die model or standardized die image. The statistical die model is then compared to silicon dies images on a silicon wafer to determine if the silicon dies have surface defects.

In one embodiment, the image acquisition system of the present invention simultaneously captures a plurality of die images in the form of a matrix of die images. An example of a matrix of silicon dies is a two by three die image matrix. The image acquisition system of the present invention uses a charge-coupled display (CCD) camera, which may be a 512 by 512 pixel CCD camera (512K CCD camera). Alternatively, a 1K×1K or 4K×4K CCD camera may be used to increase the field of view, or to increase the resolution of the image obtained over the same area as the 512K CCD camera.

The apparatus for detecting defects on silicon dies, in one embodiment, can automatically align the silicon wafer based upon a predetermined reference chip. The apparatus physically aligns the silicon wafer by instructing an automated wafer handling system as to the relative position of the silicon wafer using a coarse and a fine image adjustment.

The image acquisition system can further include a high resolution microscope for manually inspecting silicon dies, if desired. The image acquisition system of the present invention can also include an object character recognition (OCR), a Bar code reader or other system that provides the computer with information about the silicon wafer. The computer of the present invention can be connected to a display unit that displays the die images acquired by the image acquisition system. The display unit of the present invention can be, for example, a touch screen cathode ray tube that permits input from the screen to the computer. The display unit can display an image of a silicon wafer that contains a summary of the results from comparing the statistical die model with a plurality of dies. The image acquisition system of the present invention may further comprise a wafer cassette that provides the wafer handling system with silicon wafers.

The present invention also includes a method for detecting defects on silicon dies on a silicon wafer comprising the steps of, identifying a random sample of silicon dies on the surface of the silicon wafer, generating a statistical die model from the random sample, comparing the statistical die model to silicon dies, determining if the silicon dies have surface defects and displaying the results of the comparison.

More specifically, the method of the present invention involves capturing the image a plurality of silicon chips on a silicon wafer, converting the image of the silicon chips into pixels, separating the pixels into neighborhoods of pixels, determining a neighborhood value for each neighborhood of pixels, comparing each neighborhood value with the corresponding neighborhood value of the statistical die model to determine whether silicon dies are defective, and reporting the results. In the method of the present invention the neighborhood of pixels may be further defined as being a square matrix of pixels, a rectangular matrix of pixels, a circular matrix of pixels or an overlapping an adjacent neighborhood of pixels. The neighborhood of pixels may be a nine by nine matrix of pixels.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Figure 1A:
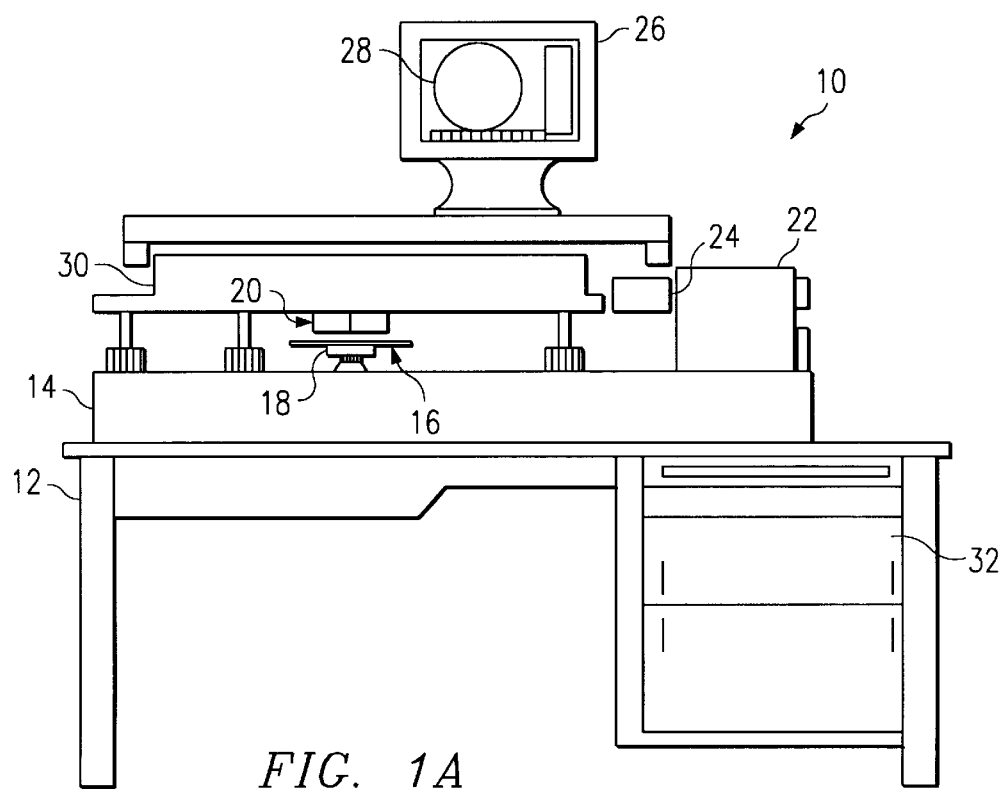
FIG. 1A is a schematic illustration of an optical silicon chip analyzer.

In FIG. 1A, a silicon wafer image acquisition system is depicted and is generally designated as 10. A table 12 supports a silicon wafer handling system 14, which is able to position a silicon wafer 16 on a chuck 18. One example of such a table is an X–Y wafer handling table, which permits direct computer control of the positioning of a chuck 18 in the X and Y directions relative to surface of table 12. The chuck 18 is able to move a silicon wafer 16 positioned on its handling surface in the Z-direction. The silicon wafer handling system 14 can precisely position silicon wafer 16 below lens optics 20. The silicon wafer handling system 14 also allows for rotation of the silicon wafer 16 to improve the alignment of the silicon wafer 16. The chuck 18 is integral to silicon wafer handling system 14 and receives the silicon wafer 16 from a silicon wafer cassette 22, and positions the silicon wafer 16 under lens optics 20. The silicon wafer 16 delivered from the silicon wafer cassette 22, is scanned in transit from the silicon wafer cassette 22 to the position under the lens optics 20 by a silicon wafer identification (wafer ID) reader 24, such as an optic character recognition or a bar code reader. Alternative positions for the wafer ID reader 24 will be apparent to those of skill in the art in light of the present disclosure. The wafer ID reader 24 identifies each unique silicon wafer 16, and transfers the information to a computer 32. The wafer ID reader 24, the silicon wafer handling system 14, the silicon wafer cassette 22, and the optical image acquisition system 30 are each controlled by computer 32.

A display unit 26 is depicted above the table 12 and is shown displaying a silicon wafer image 28 that depicts the surface of silicon wafer 16 as visualized by the lens optics 20 of the optical image acquisition system 30. In one embodiment of the present invention, the optical image acquisition system 30 is connected to the computer 32 that coordinates the function of the silicon wafer handling system 14, the lens optics 20, the silicon wafer cassette 22, the wafer ID reader 24 and the optical image acquisition system 30. The computer 32 processes the information received from these sources and displays them on the display unit 26. The display unit 26, in one embodiment, is a touch screen display unit 26 that allows the user to control the silicon wafer image acquisition system 10 by touching the screen of the display unit 26.

Figure 1B:
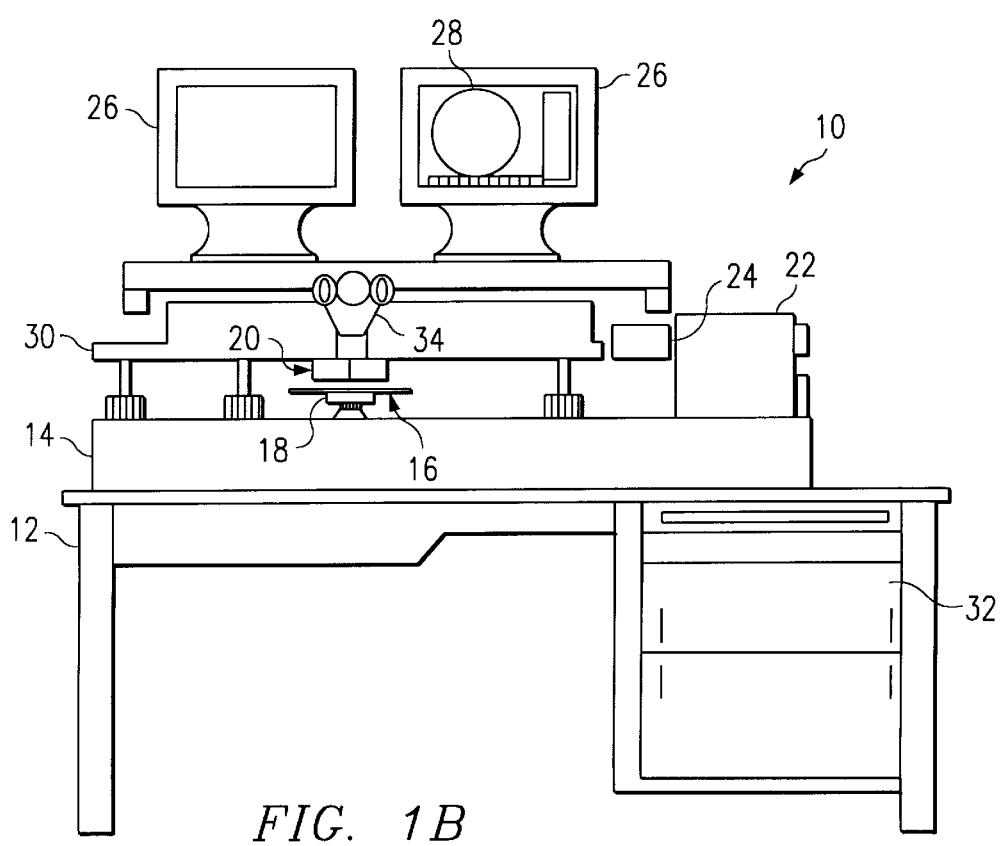
FIG. 1B is a schematic illustration of an alternative embodiment of an optical silicon chip analyzer.

FIG. 1B shows an alternative embodiment of the present invention that depicts a silicon wafer image acquisition system 10, that further includes a high resolution microscope 34. The high resolution microscope 34 is positioned in-line with the silicon wafer handling system 14 and allows the operator of the silicon wafer acquisition system 10 to monitor and visually inspect the surface of the silicon wafer 16 for quality control purposes. The high resolution microscope 34 is positioned in-line with the optical image acquisition system 30, which allows the operator to view the surface of the silicon wafer 16 using the high resolution microscope 34 in real time. The computer 32 can direct the silicon wafer handling system 14 to position the defects located on the silicon wafer 16 directly in-line with the high resolution microscope 34, for immediate manual inspection of the defects detected. The images obtained using the high resolution microscope 34 can be displayed, for example, on a second display unit 36, in this figure depicted adjacent the display unit 26 having the silicon wafer image 28.

In operation, the operator of the silicon wafer acquisition system 10 touches the screen of display unit 26 to instruct the computer 32 to direct the silicon wafer handling system 14 to acquire a silicon wafer 16 from wafer cassette 22. As the silicon wafer 16 leaves the wafer cassette 22, the wafer ID reader 24 identifies the silicon wafer 16 as it is directed to the chuck 18, that positions the silicon wafer 16 under the lens optics 20 of the optical image acquisition system 30. The wafer ID reader 24 informs the computer 32 as to the identity of the silicon wafer 16 to be imaged for processing and storage purposes. Once the silicon wafer 16 is in position, the optical image acquisition system 30 scans the image of the surface of the silicon wafer 16 for alignment streets and a reference die on the surface of the silicon wafer 16, aligns the silicon wafer 16, digitizes the image, and the output is sent to the computer 32.

The computer 32 displays on the display unit 26 an image depicting a silicon wafer image 28. If the silicon wafer 16 is misaligned, the computer 32 directs the silicon wafer handling system 14 to move the silicon wafer 16 in the theta direction to align the silicon wafer 16. The computer 32 can also direct the optical image acquisition system 30 to refocus the lens optics 20 to bring the surface of the silicon wafer 16 into the proper focal plane.

Using the silicon wafer image acquisition system 10 of the present invention, the operator directs the computer 32 to first identify particular areas of the silicon wafer 16 that may require manual visual inspection using the high resolution microscope 34. The computer 32 uses the output from the optical image acquisition system 30 to determine whether to flag the particular area of the silicon wafer 16, and more particularly an individual silicon chip, as being defective. If a particular area is identified by the computer 32 as being potentially defective, the operator can then visually inspect the potential problem to determine whether the defect would affect the functioning of the particular silicon chip on the silicon wafer 16. If the operator concurs with the determination of the computer 32, then the operator does nothing, as the computer 32 has already determined it is defective and ended its processing. If the operator determines that the surface defect does not affect the functioning of the particular layers affected, then the operator can remove the defect identifier flag, and that particular silicon chip of the silicon wafer 16 can continue toward final processing. By using the apparatus of the present invention, the operator's attention is focused on the portions of the silicon wafer 16 that may have been affected, thereby only visually inspecting the areas identified as defective.

Figure 2A:
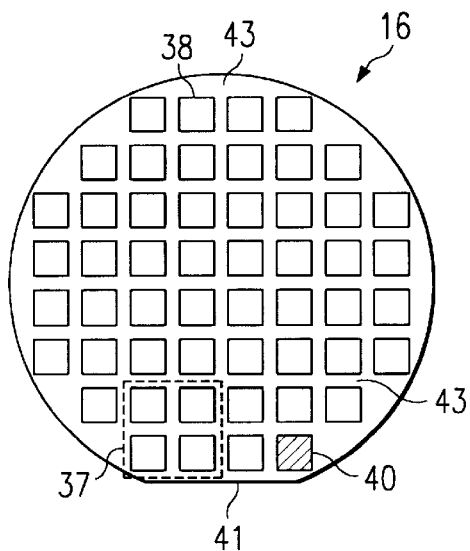
FIG. 2A is a top view of a silicon wafer having an alignment silicon chip indicated thereon.

Turning now to FIGS. 2A through 2D, a depiction of a silicon wafer 16 is shown to demonstrate the detailed operation of the wafer image acquisition system 10. FIG. 2A demonstrates the first step in the method, wherein the silicon wafer 16 is scanned and the silicon wafer 16 is aligned using, for example, the truncated area 41 of the silicon wafer 16. A more refined alignment is achieved by scanning for a reference chip 40 positioned in a specific place within the overall pattern of silicon chips 38. Other methods of aligning silicon wafers 16 may be used with the present invention, such as aligning the silicon wafer 16 based on markers created by slight changes in the surface topology of the silicon wafer 16. The aligning marks may be, for example, designed into the metalization layers of individual silicon chips 38. Alternatively, the streets 43 between the silicon chips 38 can be used to coarse align the silicon wafer 16. More refined alignment is accomplished by scanning for the edge of a silicon chips 38 that is part of a silicon chip matrix 37 along the streets 43, as well as for prominent features on the surface of reference silicon chip 40, such as large capacitors. Other methods of aligning the silicon wafer 16 include bright-field microscopic methods, dark-field microscopic methods that detect light scattered from the edges of depressions, and interferometric detection built into the lithographic projection lens, as is known to those of skill in the art of wafer alignment.

Figure 2B:
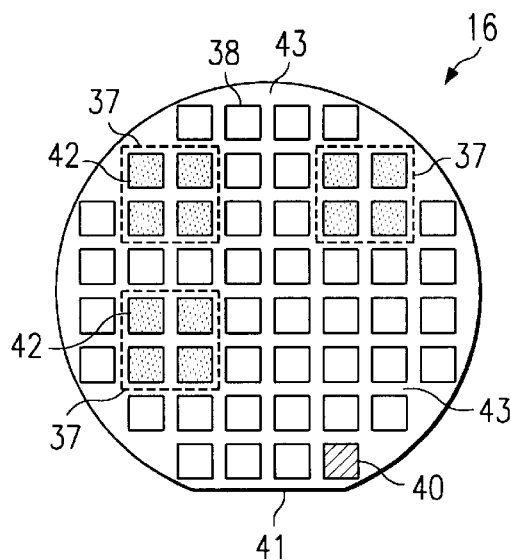
FIG. 2B is a top view of a silicon wafer having randomly selected silicon chips indicated thereon.

Once the silicon wafer 16 has been aligned, a random sampling of silicon chips 38, depicted in FIG. 2B as a silicon chip matrix 37 of randomly selected silicon chips 42, are scanned and processed to determine a baseline image and to create a statistical die model or "standardized" silicon chip matrix. The computer generated statistical die model matrix may be created for each silicon wafer 16 or for each batch of silicon wafers 16 that are processed together. The statistical die model should be generated at least at a batch level because slight differences during processing make the contrast of each batch of silicon wafers 16 slightly different.

Depending on the size of the silicon chip 38, one or more silicon chips 38 are concurrently captured by the optical image acquisition system 30 as part of silicon chip matrix 37. For example, the average field of view of a 512K CCD camera is approximately 250 by 150 mils. This field of view provides a magnification of between 70× and 90×, with an image resolution of better than 4 microns. The present invention takes advantage of the entire field of view, and the pixels captured thereby, to simultaneously scan a silicon chip matrix 37, which contains multiple silicon chips 38.

The number of individual silicon chips 38 that are part of a silicon chip matrix 37 will depend on the size of the silicon chip 38 and the size of the field of view that the CCD camera can capture. For an average size silicon chip 38 using a 512 K CCD camera, a silicon chip matrix 37 of two by three silicon chips 38 is attainable. For larger silicon chips 38 a one by two matrix may be the best fit for a 250 by 150 mil field of view. As silicon chips 38 become smaller in size, however, the present invention will be able to simultaneously capture more silicon chips 38 within a silicon chip matrix 37. With a more powerful camera, such as a 1K or a 2K CCD camera, a larger field may be captured such that silicon chip matrix 37 may be a four by three, a three by three, a four by four, or greater silicon chip matrix 37. Alternatively, the same size field of view may be captured with a higher resolution.

The next step in the analysis at the pixel level is the processing of gray scale values returned by the individual sensors of the CCD camera. To improve the processing speed of the defect analysis without compromising accuracy, the computer 32 groups individual pixels into neighborhoods of pixels, or neighborhoods, and determines a neighborhood value based upon the gray scale values of the individual pixels thus, obtaining for each neighborhood, a mean gray scale value.

The size of the pixel matrix that comprises each neighborhood of pixels will vary with the resolution required to define the layers disposed on the silicon wafer 16. If very large features are being scanned, then a larger neighborhood may be selected, while finer structures may require higher precision. The shape of the neighborhood may also be varied depending on the type of layers being scanned, as is the selection of the staring point for the matrix of pixels. Alternatively, overlapping matrices of pixels may be desired.

By determining mean gray scale neighborhood values, any minor defects that are present in the silicon chips 38 of the random sample become statistically insignificant in the resulting statistical die model matrix. Similarly, if one or more neighborhood values of one silicon chip matrix 37 of the random sample is out of line with corresponding neighborhood values of the other silicon chip matrices 37 of the random sample, that silicon chip matrix 37 will be excluded by computer 32 in developing the statistical die model matrix. In addition, by determining neighborhood values, the present invention solves the problem caused by the inherent defects of CCD cameras, namely, defects of individual sensors within the sensor grid, and slight variations in the sensitivity of the individual sensors.

Figure 2C:
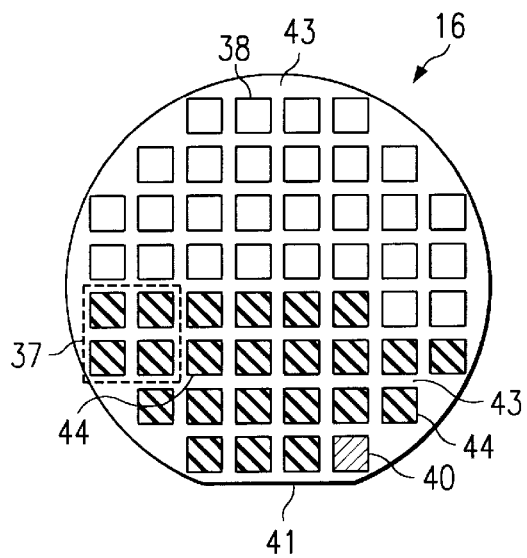
FIG. 2C is a top view of a silicon wafer undergoing a scan for surface defects on individual silicon chips.

Once the randomly selected silicon chips 42 are scanned, and a baseline statistical die model determined for each neighborhood of pixels for each of the silicon chip images, the optical image acquisition system 30 can scan every silicon chip matrix 37 on the silicon wafer 16, as depicted in FIG. 2C. The computer 32 compares the statistical die model matrix values for each neighborhood of pixels to the value returned for the silicon chip matrix 37 being scanned to determine if the values for each neighborhood of pixels of silicon chips 38 match those of statistical die model matrix. If a silicon chip matrix 37 does not match the statistical die model matrix, then the computer 32 flags the silicon chip 38 within the silicon chip matrix as a bad silicon chip 44. The position of the silicon chip 38 within the silicon chip matrix 37, within the silicon wafer 16 is stored in memory, as is the exact neighborhood location of the defect.

By sampling a silicon chip matrix 37 the present invention increases the processing speed of the overall operation. Using the mean gray scale value for each neighborhood of pixels not only increases the resolution of the scan by providing subpixel values, but also factors in the differences in the background contrast of silicon wafers 16. The differences in background contrast are the result of differences in processing between different batches of silicon wafers 16, within lots of silicon wafers 16 and even between the center and the edges of individual silicon wafers 16.

The present invention minimizes the effect of the differences in background contrast, when analyzing individual silicon chips 38, in two ways. First, by generating a statistical die model of mean gray scale die values wide variations in pixel values from the random silicon chip matrices 37 are excluded and background effects minimized. Second, the statistical die model threshold is automatically adjusted for silicon chips 38 along the edges of the silicon wafer 16 when a threshold level, for example, when 25% or more of the silicon chips 38 fail. Typically, silicon chips 38 along the edge of silicon wafers 16 are known to have darker coloration, thereby triggering the change in the threshold level. The present invention automatically adjusts the threshold for the acceptable mean gray scale value for those silicon chips 38 along the edge of the silicon wafer 16 in order to more accurately reflect the defect rate.

Surface defects on silicon chips 38 are detected at the neighborhood level by comparing the neighborhood value from the silicon chip matrix 37 being scanned with the corresponding neighborhood value of the statistical die model matrix. Any gross deviation between the neighborhood values will greatly affect the die value. Thus, the neighborhood level comparison not only identifies the location of defects on silicon chips 38, but also, the area within an individual silicon chip 38 that may have a functional defect.

One problem that may arise using the statistical methods of the present invention is the potential off-set of defects caused by the averaging of a dark and a light defect within the same silicon chip 38. If a dark defect is off-set by a light defect within a neighborhood, the silicon chip 38 would return a normal value for that neighborhood because the two defects lead to a neighborhood value that falls within the norm. The off-set of two or more defects, however, has not been found to be a problem, as defects for every silicon wafer 16 are generally far less than 1 per silicon chip 38. Also, concurrent defects within a silicon chip 38 generally indicate gross defects in the silicon wafer 16, which will also be observed in adjacent neighborhoods or silicon chips 38. Such concurrent defects may be caused by, for example, scratches on surface of the silicon wafer 16.

Figure 2D:
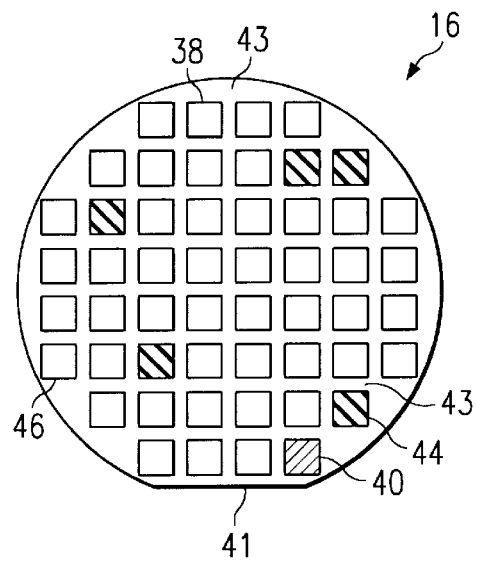
FIG. 2D is a top view of a silicon wafer depicting a final defect map of the potential surface defects on individual silicon chips.

FIG. 2D shows a representation of a silicon wafer 16 once the scan of the silicon chips 38 is complete. The computer 32 generates a map of the silicon wafer 16 that shows the good silicon chips 46 and the bad silicon chips 44.

Figure 3A:
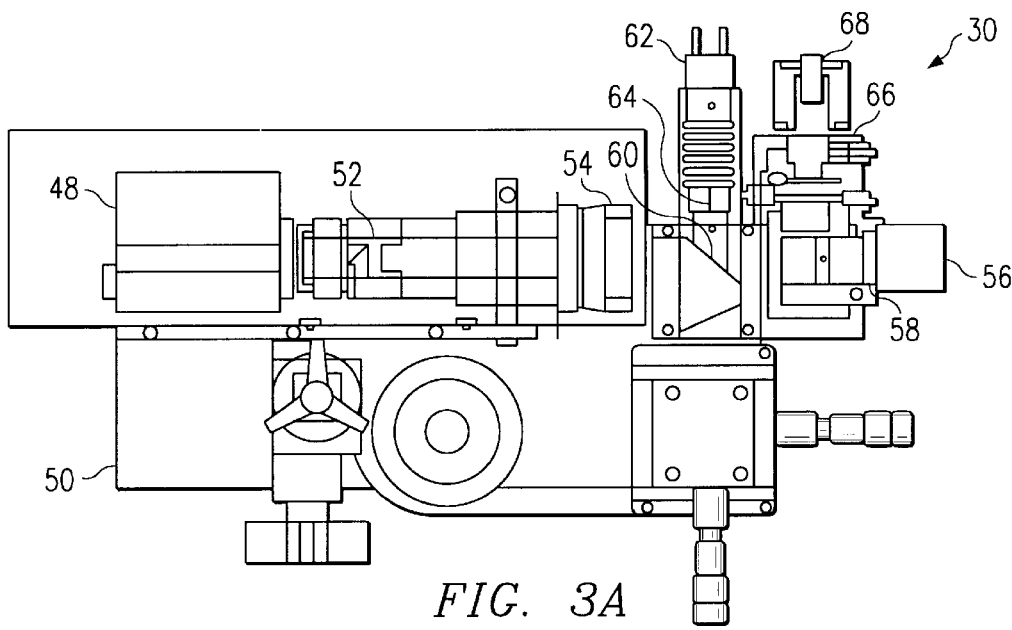
FIG. 3A is a side view of the optical image acquisition system of the present invention.

FIG. 3A shows a diagram of one embodiment of the optical image acquisition system 30 of the present invention. A high resolution camera 48 is placed on an optics table 50. The high resolution camera 48 is connected to a negative achromatic lens 52, which is connected to a lens 54. The high resolution camera 48 may be, for example, a Sony® charge-coupled display (CCD) camera and the lens 54 may be 105 millimeters. Other size cameras and lenses may be substituted as will be known to those of skill in the art of video-microscopy.

The image of a silicon wafer 16 that is obtained by the high resolution camera 48 enters the optical image acquisition system 30 through a splitter cube 56. The image of the silicon wafer 16 then passes a Gaertner lens 58 and a beam splitter 60 before reaching the lens 54. In order to provide lighting for the surface of the silicon wafer 16, a lamp 62 shines light through a diffuser 64, through the beam splitter 60, through the Gaertner lens 58 and through the splitter tube 56, on to the surface of silicon wafer 16. Those of skill in the art of lens optics will realize that other equivalent configurations of the above may be used with the present invention.

In one embodiment, an optical switch 66 and a stepper motor 68, are disposed between the splitter tube 56 and the beam splitter 60, and are used to focus the image of silicon wafer 16. The optical switch 66 and the stepper motor 68 may be used to focus the image of silicon wafer 16 either manually, or through a computer 32.

Figure 3B:
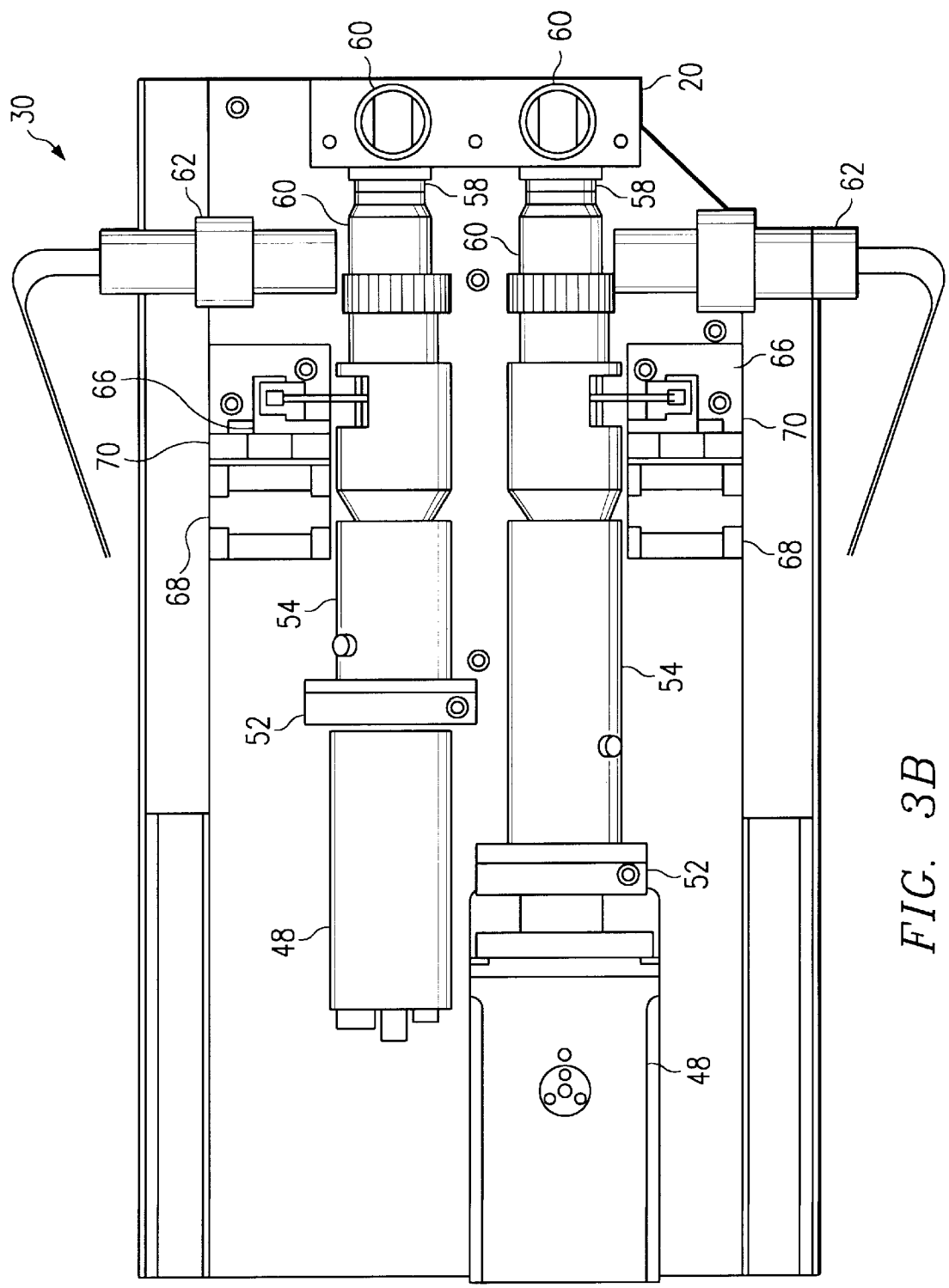
FIG. 3B is a top view of an alternative embodiment of the optical image acquisition system of the present invention.

FIG. 3B shows an alternative embodiment of the present invention having two high resolution cameras 48 that are positioned in parallel. One of skill in the art, will know that the positioning of the cameras relative to each other can be varied according to space and positioning constraints.

The high resolution cameras 48 are connected to negative achromatic lenses 52 that are connected to lenses 54. In the embodiment depicted in FIG. 3B, the lens optics 20 contain two beam splitters 60 connected to Gaertner lenses 58. Beam splitters 60 receive the images from the Gaertner lenses 58, and receive the diffused light from lamp 62 in order to provide lighting for the surface of the silicon wafer 16 (not depicted). In this embodiment, the focusing mechanism 70 is located between the lenses 54 and the beam splitter 60. The focusing mechanism 70 is comprised of an optical switch 66 and a stepper motor 68. The focusing mechanism 70 may be self-adjusting or may be under the control of the computer 32.

In operation, the image of the surface of a silicon wafer 16 is obtained through the optical image acquisition system 30 and the image is digitized. The digitized image is scanned for reference chip 40 that is located on the silicon wafer 16. Using the reference chip 40 the computer 32 determines whether the silicon wafer 16 is aligned. If the image is aligned, the silicon wafer image is further processed. If the silicon wafer 16 is not aligned the computer 32 directs the silicon wafer handling system 14 to rotate the silicon wafer 16 until the image is aligned.

Once the image of the silicon wafer 16 is aligned, a statistical die model matrix is obtained by analyzing the images of randomly selected silicon chip matrices 37 to create a real-time database of the mean gray scale values for each neighborhood of pixels within each silicon chip matrix 37, as described hereinabove. Based on the information in the real-time database, a statistical die model is created and the silicon wafer 16 is analyzed for defects.

Figure 4:
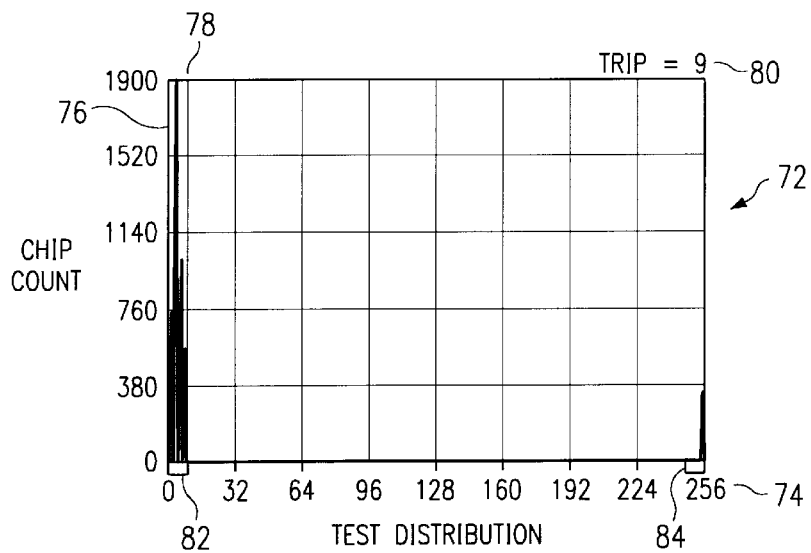
FIG. 4 is a histogram of the die value reported for each silicon chip associated with the results from scanning a silicon wafer.

FIG. 4 is a histogram 72, where each point represents the reported overall gray scale pixel value or die value, which represents the mean gray scale value for all neighborhoods within each silicon chip 38 that is scanned for defects. The X-axis 74 of the histogram 72 represents the die values on a gray scale ranging from 0 to 256. The Y-axis 76 represents the frequency of silicon chips 38 that have particular die value. If few defects are present, then the bin values along the vertical axis will be tightly grouped. A trip line 78 along the X-axis 74 is specified based on the die value of the statistical die model determined during the random scan of silicon chip matrices 37 on the silicon wafer 16.

The trip line 78 can also be represented numerically as a trip point 80, which represents the pass/fail boundary of the silicon chip 38. The trip point 80 is dynamic and can change over time, as trip point 80 settings are determined in real time based on the histogram profile of the silicon wafer 16 being analyzed. The trip point 80 can be changed manually or automatically. For example, when silicon chips 38 along the edge of the silicon wafer 16 are being analyzed a large number of defects may be reported because they are known to have a darker background.

The present invention automatically moves the trip point 80 when a threshold value such as 25% of the silicon chips 38 are reported as defective, thereby changing silicon chips 38 incorrectly reported as bad silicon chips 44 to good silicon chips 46. The silicon chips 38 were incorrectly reported as bad silicon chips 44 because of differences in lighting and contrast, not because of defects at the overall die level. If defects in an individual neighborhood or neighborhoods of pixels are detected, however, the silicon chip 38 will remain a bad silicon chip 44. This example shows how the present invention performs its analysis at two levels, the pixel neighborhood level and the overall die level. By correcting the overall threshold value as the die level for lighting and contrast, the present invention can compensate these differences at the die level. At the same time, the present invention can continue to report as defective specific silicon chips 38 with defects at the pixel level, even after an adjustment at the die threshold level has been made.

The histogram data points 82 represent the number of test points having a common value and play an important role in determining the pass/fail profile of each silicon wafer 16. When a data point fails to fall within the expected parameters based on the statistical die model matrix, that particular silicon chip 38 is identified as having a potential defect that may affect the performance of the silicon chip 38. The failures points 84 are depicted in histogram 72 at bin 255.

The histogram 72 reports the die value obtained for each silicon chip 38 of the silicon wafer 16 scanned. The die value for each silicon chip 38 is plotted on histogram 72 and is obtained statistically from the neighborhood values. As with the neighborhood values, the die value for each silicon chip 38 in silicon chip matrix 37 is based on a 256 gray scale. The silicon chips 38 within a statistical die model are generally plotted as having a die value of, for example, around 12 to 15 on the 256 gray scale, because that is generally the value detected by the CCD camera. A threshold level is chosen above the statistical die model so that silicon chips 38 that are statistically similar to the statistical die model are plotted as passing.

If the statistical die model matrix is a valid reflection of the silicon chips 38 on the silicon wafer 16, then die value for the individual silicon chips 38 will fall between 0 and trip point 80. If the statistical die model is a not a valid reflection of a silicon chip matrix 37, then the number of silicon chips 38 outside the 0 to trip point 80 die value range will be large. If the number of silicon chips 38 outside the range is large, this indicates that the entire silicon wafer 16 may have to be discarded because too many of the individual silicon chips 38 are defective or that the statistical die model is invalid. One of skill in the art will realize that a different trip point 80 may be selected depending on the type of silicon wafer 16 being analyzed. A variation encompassed by the present invention is reversal of the gray scale values (from light to dark) or selection of die values between 12 and 256 as the trip point 80.

Most of the silicon chips 38 fall within a narrow range of bin values, usually less than 10–15 bin numbers for over 95% of the silicon chips 38. If the values for the silicon chips 38 spread over a wider range of bin values, then the silicon wafer 16 may be misaligned, the lens optics 20 may not be in focus, or a major part of the silicon chips 38 may be defective. To correct the problem the silicon wafer 16 may be rotated based on a different reference chip 40, or another silicon wafer 16 can be tested. If three or more silicon wafers 16 are found to be produce histograms 72 with a variance of 5% in bin values, the entire lot of silicon wafers 16 may be defective.

Figure 5:
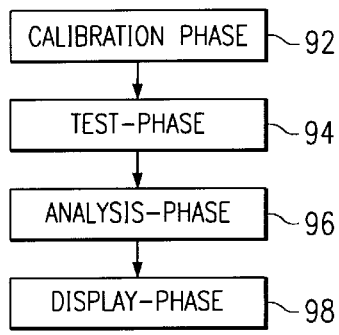
FIG. 5 is a flow chart of the image acquisition process and analysis.

FIG. 5 is a flow chart 90 of the process used by the silicon wafer image acquisition system 10 of the present invention to calibrate the optical image acquisition system 30, to calculate the statistical die model matrix, to analyze the silicon chips 38 on the silicon wafer 16, and to display the results on a display unit 26. The inspection of a silicon wafer 16 comprises four steps, starting with the calibration phase 92.

In the calibration phase 92, an input image of the silicon wafer 16 is acquired and placed into a first buffer, which may be a VSI buffer. From the first buffer, the search area portions of the silicon wafer 16 are obtained and placed into a second buffer, such as an IPA buffer, and the image is tested for alignment. If the silicon wafer 16 is not properly aligned, then the computer 32 uses the information in the first and the second buffers to create alignment offsets that are used to position the wafer in alignment. These alignment offsets can be further broken down into integer (whole-pixel) or fractional (sub-pixel) offsets.

In the second phase, test phase 94, an area of interest is selected and the video inputs of the image acquisition system 30 are reset so that the entire test area can be acquired. The computer 32 then performs a sub-pixel shift analysis of the alignment and places the image of the properly aligned test image into a memory bus. The properly aligned test image is then compared to the previously acquired image in the calibration phase 92, and the image is subtracted to obtain a "thresholded-minus-difference" image, which is the statistical die model matrix.

In the third phase, analysis phase 96, the average gray scale value for each neighborhood of pixels on statistical die model matrix is compared to the equivalent area on the silicon chip matrix 37 being scanned. The die value for each silicon chip 38 is plotted on a histogram 72, and result statistics are obtained. The resulting statistics are stored for each individual silicon chip 38 within a silicon chip matrix 37, so that the computer 32 can store, track, analyze and report the results of the analysis phase 96.

In the fourth phase, display phase 98, the results may be displayed in a variety of ways. The results can be, for example, stored to disk, displayed as a list, displayed on a display unit 26 as a list or as a graphical representation of a silicon wafer 16. Individual silicon chips 38 can be identified as being good silicon chip 44 or bad silicon chip 46. Reference chip 40 can also be displayed. The results can also be displayed as boxes, which may be in colors, representing the different results.

Based on the results of analysis phase 96, as displayed in the display phase 98, a user can pre-determine areas of interest within the silicon wafer 16, and in particular, specific areas of a silicon chip 38 for visual inspection.

The silicon wafer image acquisition system 10 of the present invention is able to rapidly and automatically align the silicon wafer 16 and obtain a statistical die model matrix image based on a random sampling of silicon chip matrices 37. The statistical die model matrix reflects not only the variations in silicon wafer 16 background reflectivity but also variations in the processing of different batches of silicon wafers 16. By taking into consideration the intrinsic variation within a silicon wafer 16 batch, the system automatically adjusts the relative gray scale values recorded for each neighborhood of pixels within a silicon chip 38.

Other advantages of the present invention include the scanning of each and every silicon chip 38 on a silicon wafer 16 to determine which silicon chips 38 have potential defects, thereby predetermining which silicon chips 38 should be manually inspected. The preselection of defective silicon chips 38 greatly reduces the number of silicon chips 38 that must be inspected by identifying problem areas and eliminating the need to reject the entire silicon wafer 16 based on a cursory manual inspection. The present invention also greatly increasing the efficiency of manual inspection by saving silicon chips 38 that, although having some defect, are identified during a manual inspection as not being on a gate, via or conduit, and therefore, not affecting the performance of the silicon chip 38.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus for detecting defects on integrated circuit dies on a semiconductor wafer comprising:
   an image acquisition system for obtaining images corresponding to a plurality of said dies; and
   a computer coupled to said image acquisition system and programmed to perform a plurality of operations comprising:
      generating a statistical die model from a sample of said images;
      for each of a plurality of pixel locations in the images, determining a mean brightness value corresponding to a location of the associated die;
      for each of the plurality of dies, determining a mean die brightness value from the mean brightness values of the pixel locations corresponding to the die; and
      comparing the mean die brightness value of each die to said statistical die model to determine whether the die has a surface defect.

2. The apparatus as recited in claim 1 wherein said plurality of die images further includes a matrix of adjacent dies.

3. The apparatus as recited in claim 2 wherein said matrix is a three by two matrix.

4. The apparatus as recited in claim 1 further comprising:
   a wafer handling system for positioning said wafer in alignment with said image acquisition system; and
   a wafer ID reader that provides said computer with information about said wafer.

5. An apparatus for detecting defects on an integrated circuit die on a semiconductor wafer, comprising:
   an image acquisition system for obtaining images of a plurality of said dies;
   a wafer handling system for positioning said wafer in alignment with said image acquisition system;
   a computer coupled to said image acquisition system wherein said computer generates a statistical die model from a sample of said images and compares said statistical die model to said images to determine whether said dies have surface defects; and
   an object character recognition reader for reading wafer identification information from the wafer and providing the wafer identification information to said computer.

6. The apparatus of claim 4 wherein said wafer ID reader is further defined as a bar code reader.

7. The apparatus as recited in claim 1 further comprising a high resolution microscope.

8. The apparatus as recited in claim 1 wherein said image acquisition system further comprises a 512 by 512 pixel charge-coupled display camera.

9. The apparatus as recited in claim 1 wherein said image acquisition system further comprises a 1K×1K charge-coupled display camera.

10. The apparatus as recited in claim 1 wherein said image acquisition system is further defined as comprising a 4K×4K charge-coupled display camera.

11. The apparatus as recited in claim 1 wherein said computer is connected to a display unit that displays said images.

12. The apparatus as recited in claim 1 further comprising a wafer cassette that provides wafers to said wafer handling system.

13. An apparatus for detecting defects on integrated circuit dies on a semiconductor wafer, comprising:
   a wafer cassette;
   a wafer handling system connected to said wafer cassette for handling wafers;
   an image acquisition system positioned to view said wafer on said wafer handling system for obtaining images corresponding to a plurality of said dies;
   a wafer ID reader that identifies the wafer viewed by the image acquisition system; and
   a computer for controlling said wafer cassette, said wafer ID reader, said wafer handling system, and said image acquisition system, and programmed to perform a plurality of operations comprising:
      generating a statistical die model from a sample of said images;
      for each of a plurality of pixel locations in the images, determining a mean brightness value corresponding to a location of the associated die;
      for each of the plurality of dies, determining a mean die brightness value from the mean brightness values of the pixel locations corresponding to the die; and
      comparing the mean die brightness value of each die to said statistical die model to determine whether the die has a surface defect.

14. The apparatus as recited in claim 13 wherein said computer is connected to a display unit that displays said images.

15. An apparatus for detecting defects on a die on a wafer, comprising:
   a wafer cassette;
   a wafer handling system connected to said wafer cassette for handling wafers;
   an image acquisition system positioned to view said wafer on said wafer handling system for simultaneously obtaining images of a plurality of said dies;
   a wafer ID reader that identifies the wafer viewed by the image acquisition system;
   a computer connected to, and controlling, said wafer cassette, said wafer ID reader, said wafer handling system, and said image acquisition system, wherein said computer generates a statistical die model from a sample of said images and compares said statistical die model to said images to determine whether said dies have surface defects; and
   a touch screen cathode ray tube for displaying said images, and for forwarding received touch input to said computer.

16. The apparatus as recited in claim 13 wherein said computer automatically aligns said wafer based on a reference die.

17. The apparatus as recited in claim 13 further comprising a high resolution microscope.

18. The apparatus as recited in claim 1, wherein said computer is programmed to perform the comparing operation by:
  comparing the mean die brightness value to a pass/fail threshold; and
  storing a failing indicator in memory for each die having a mean die brightness value beyond the pass/fail threshold.

19. The apparatus as recited in claim 18, wherein the pass/fail threshold corresponds to a range of acceptable mean die brightness values.

20. The apparatus as recited in claim 18, wherein the computer is programmed to dynamically set the pass/fail threshold based upon the mean die brightness values determined for the plurality of dies on the wafer.

21. The apparatus as recited in claim 18, wherein the computer is further programmed to perform the operations of:
  counting the number of dies on the wafer determined to be defective;
  responsive to the number of defective dies exceeding a threshold value, adjusting the pass/fail threshold.

22. The apparatus as recited in claim 21, wherein the computer is further programmed to perform the operations of:
  also responsive to the number of defective dies exceeding the threshold value, comparing each of the mean brightness values, associated with each die previously determined to be defective, to the statistical die model to identify those pixel locations having significant mean brightness value deviations from the statistical die model.

23. The apparatus as recited in claim 1, wherein the computer is further programmed to perform the operations of:
  responsive to determining that a die has a surface defect, comparing each of the mean brightness values associated with the die, to the statistical die model, to identify those pixel locations of the die having significant mean brightness value deviations from the statistical die model.

24. The apparatus as recited in claim 1, wherein the computer performs the operation of determining a mean brightness value by:
  for each pixel location, determining an average of the brightness among the pixel location and a selected group of neighboring pixel locations.

25. The apparatus as recited in claim 13, wherein said computer is programmed to perform the comparing operation by:
  comparing the mean die brightness value to a pass/fail threshold; and
  storing a failing indicator in memory for each die having a mean die brightness value beyond the pass/fail threshold.

26. The apparatus as recited in claim 25, wherein the pass/fail threshold corresponds to a range of acceptable mean die brightness values.

27. The apparatus as recited in claim 25, wherein the computer is programmed to dynamically set the pass/fail threshold based upon the mean die brightness values determined for the plurality of dies on the wafer.

28. The apparatus as recited in claim 25, wherein the computer is further programmed to perform the operations of:
  counting the number of dies on the wafer determined to be defective;
  responsive to the number of defective dies exceeding a threshold value, adjusting the pass/fail threshold.

29. The apparatus as recited in claim 28, wherein the computer is further programmed to perform the operations of:
  also responsive to the number of defective dies exceeding the threshold value, comparing each of the mean brightness values, associated with each die previously determined to be defective, to the statistical die model to identify those pixel locations having significant mean brightness value deviations from the statistical die model.

30. The apparatus as recited in claim 13, wherein the computer is further programmed to perform the operations of:
  responsive to determining that a die has a surface defect, comparing each of the mean brightness values associated with the die, to the statistical die model, to identify those pixel locations of the die having significant mean brightness value deviations from the statistical die model.

31. The apparatus as recited in claim 13, wherein the computer performs the operation of determining a mean brightness value by:
  for each pixel location, determining an average of the brightness among the pixel location and a selected group of neighboring pixel locations.

* * * * *